(12) United States Patent
Kojima et al.

(10) Patent No.: US 8,878,294 B2
(45) Date of Patent: *Nov. 4, 2014

(54) SEMICONDUCTOR DEVICE HAVING A DRAIN-GATE ISOLATION PORTION

(71) Applicant: Rohm Co., Ltd., Kyoto (JP)

(72) Inventors: Mitsuo Kojima, Kyoto (JP); Shoji Takei, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/941,458

(22) Filed: Jul. 13, 2013

(65) Prior Publication Data

US 2013/0292765 A1     Nov. 7, 2013

Related U.S. Application Data

(63) Continuation of application No. 12/452,169, filed as application No. PCT/JP2008/061246 on Jun. 19, 2008, now Pat. No. 8,513,766.

(30) Foreign Application Priority Data

Jun. 19, 2007 (JP) ................................. 2007-161493

(51) Int. Cl.
| | |
|---|---|
| *H01L 27/092* | (2006.01) |
| *H01L 21/8238* | (2006.01) |
| *H01L 29/08* | (2006.01) |
| *H01L 29/66* | (2006.01) |
| *H01L 29/78* | (2006.01) |
| *H01L 27/088* | (2006.01) |
| *H01L 29/06* | (2006.01) |
| *H01L 29/10* | (2006.01) |

(52) U.S. Cl.
CPC ...... *H01L 27/092* (2013.01); *H01L 21/823814* (2013.01); *H01L 21/82385* (2013.01); *H01L 21/823857* (2013.01); *H01L 21/823892* (2013.01); *H01L 27/0922* (2013.01); *H01L 27/0928* (2013.01); *H01L 29/0847* (2013.01); *H01L 29/66659* (2013.01); *H01L 29/7835* (2013.01); *H01L 27/088* (2013.01); *H01L 29/0653* (2013.01); *H01L 29/1045* (2013.01); *H01L 29/7833* (2013.01)
USPC .................... 257/338; 257/335; 257/E29.256

(58) Field of Classification Search
USPC ................. 257/335, 338, 500, 501, E29.256, 257/E27.062
See application file for complete search history.

(56) References Cited

U.S. PATENT DOCUMENTS

| | | |
|---|---|---|
| 6,172,401 B1 | 1/2001 | Brand |
| 6,548,874 B1 | 4/2003 | Efland et al. |

(Continued)

FOREIGN PATENT DOCUMENTS

| | | |
|---|---|---|
| JP | 8-213601 | 8/1996 |
| JP | 11-186543 A | 7/1999 |

(Continued)

*Primary Examiner* — Tucker Wright
(74) *Attorney, Agent, or Firm* — Rabin & Berdo, P.C.

(57) ABSTRACT

An inventive semiconductor device includes a semiconductor layer, a source region provided in a surface layer portion of the semiconductor layer, a drain region provided in the surface of the semiconductor layer in spaced relation from the source region, a gate insulation film provided in opposed relation to a portion of the surface of the semiconductor layer present between the source region and the drain region, a gate electrode provided on the gate insulation film, and a drain-gate isolation portion provided between the drain region and the gate insulation film for isolating the drain region and the gate insulation film from each other in non-contact relation.

22 Claims, 8 Drawing Sheets

(56) References Cited

U.S. PATENT DOCUMENTS

| | | |
|---|---|---|
| 6,717,204 B1 | 4/2004 | Furuhata et al. |
| 2001/0009288 A1 | 7/2001 | Kojima et al. |
| 2001/0040266 A1 | 11/2001 | Pozzoni et al. |
| 2005/0029616 A1 | 2/2005 | Noda et al. |
| 2005/0194646 A1 | 9/2005 | Inoue et al. |
| 2006/0113627 A1 | 6/2006 | Chen et al. |
| 2006/0163623 A1 | 7/2006 | Noda et al. |
| 2007/0128788 A1 | 6/2007 | Lee et al. |

FOREIGN PATENT DOCUMENTS

| | | |
|---|---|---|
| JP | 2001-168210 | 6/2001 |
| JP | 2005-045147 A | 2/2005 |
| JP | 2006-210584 A | 8/2006 |
| JP | 2006-237341 | 9/2006 |

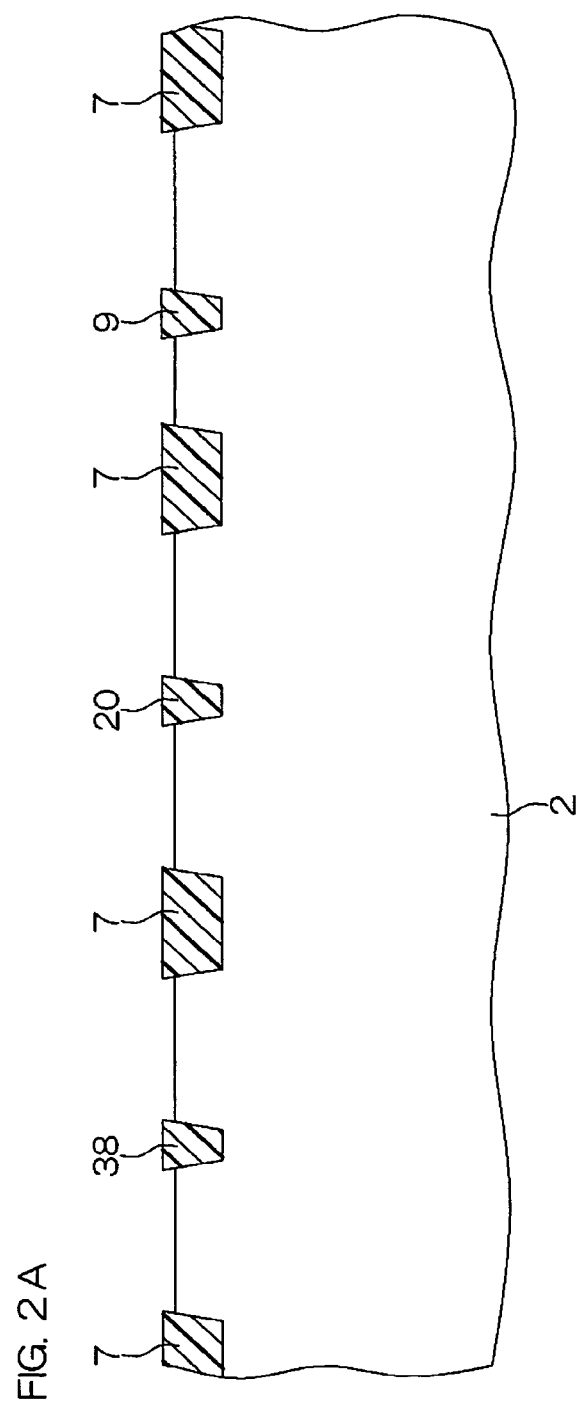

US 8,878,294 B2

SEMICONDUCTOR DEVICE HAVING A DRAIN-GATE ISOLATION PORTION

This is a Continuation of U.S. application Ser. No. 12/452,169, filed, on Dec. 18, 2009, and allowed on Apr. 15, 2013, which was a National Stage application of PCT/JP2008/061246, filed Jun. 19, 2008, the subject matters of which are incorporated herein by reference.

TECHNICAL FIELD

The present invention relates to a semiconductor device having a MOS transistor.

BACKGROUND ART

Semiconductor devices having an integrated circuit (driver IC) for driving a liquid crystal display panel, for example, are often configured such that plural types of MOSFETs (metal oxide semiconductor field effect transistors) having different breakdown voltages are mounted on a semiconductor substrate.

FIG. 4 is a sectional view showing the basic construction of such a MOSFET.

The MOSFET includes, for example, a source region 103 and a drain region 104 provided on opposite sides of a channel region 102 in a surface of a silicon substrate 101. A gate oxide film 105 of $SiO_2$ (silicon oxide) is provided on the channel region 102 as extending between the source region 103 and the drain region 104. A gate electrode 106 of polysilicon is provided on the gate oxide film 105.

The MOSFET having such a construction has a lower breakdown voltage on the order of 5 V, because field concentration (higher electric field) occurs in the vicinity of the drain region 104. An LDD (lightly doped drain) structure is known as capable of relieving the field concentration in the vicinity of the drain region 104. Even with the LDD structure, it is only possible to increase the breakdown voltage to about 7 V. Therefore, the MOSFET shown in FIG. 4 is generally used as a low breakdown voltage MOSFET.

A DMOSFET (double diffused metal oxide semiconductor field effect, transistor) is known as having a high breakdown voltage on the order of 10 V or higher. However, the DMOSFET is substantially different in construction from the MOSFET shown in FIG. 4. Therefore, where the DMOSFET and the MOSFET are to be mounted on the same semiconductor substrate, a process for fabricating the DMOSFET and the MOSFET is significantly complicated.

Further, if a surge voltage is inputted into the drain region 104 of the MOSFET having the construction shown in FIG. 4, a surge current flows to be concentrated on an end portion of the gate oxide film 105 adjacent to the drain region 104, resulting in breakdown of the end portion of the gate oxide film 105 (so-called ESD (electrostatic discharge) breakdown). The DMOSFET also suffers from ESD breakdown of its gate oxide film, because the gate oxide film contacts an epitaxial layer serving as a drain region.

Patent Document 1: JP-A-HEI11 (1999)-186543

DISCLOSURE OF THE INVENTION

Problems to be Solved by the Invention

It is therefore an object of the present invention to provide a semiconductor device including a MOS transistor which has a higher breakdown voltage and a higher ESD resistance, and can be easily mounted together with other type or MOS transistor.

Means for Solving the Problems

According to an inventive aspect as set forth in claim 1 to achieve the aforementioned object, there is provided a semiconductor device, which includes a semiconductor layer, a source region provided in a surface layer portion of the semiconductor layer, a drain region provided in the surface of the semiconductor layer in spaced relation from the source region, a gate insulation film provided in opposed relation to a portion of the surface of the semiconductor layer present between the source region and the drain region, a gate electrode provided on the gate insulation film, and a drain-gate isolation portion provided between the drain region and the gate insulation film for isolating the drain region and the gate insulation film from each other in non-contact relation.

With this arrangement, the source region and the drain region are provided in spaced relation in the surface of the semiconductor layer. The gate insulation film is provided in opposed relation to the surface portion of the semiconductor layer present between the source region and the drain region. The gate electrode is provided on the gate insulation film. The drain-gate isolation portion is provided between the drain region and the gate insulation film. The drain-gate isolation portion isolates the drain region and the gate insulation film from each other in non-contact spaced relation.

In a MOS transistor including the source region, the drain region, the gate insulation film and the gate electrode, the drain region and the gate insulation film are spaced from each other, whereby an electric field generated between the drain region and the gate insulation film is weakened. This prevents the field concentration from occurring in the vicinity of the drain region, thereby preventing the breakdown of the gate insulation film which may otherwise occur due to the field concentration. Therefore, even if the thickness of the gate insulation film is reduced, the MOS transistor has a higher breakdown voltage. In addition, the reduction in the thickness of the gate insulation film reduces ON-resistance. As a result, it is possible to achieve improvement in the breakdown voltage of the MOS transistor as well as the reduction in ON-resistance.

Since the drain region and the gate insulation film are spaced from each other, a surge current flows to be distributed into the semiconductor layer from the drain region when a surge voltage is inputted into the drain region. Therefore, the surge current does not flow into the gate insulation film from the drain region, and the field concentration does not occur between the drain region and the gate insulation film. Thus, the MOS transistor has a higher ESD resistance.

Further, the MOS transistor including the source region, the drain region, the gate insulation film and the gate electrode is of a planar type and, therefore, can be easily mounted together with other planar type of MOS transistor on the same semiconductor substrate.

The semiconductor device may include, for example, a CMOS (complementary metal oxide semiconductor) transistor in addition to the MOS transistor including the source region, the drain region, the gate oxide film and the gate electrode. In this case, the MOS transistor and the CMOS transistor may be isolated from each other by a device isolation portion formed by filling a trench formed in the surface of the semiconductor layer with a dielectric.

Where the device isolation trench is provided, the drain-gate isolation portion is preferably formed by filling a trench having the same depth as that of the device isolation portion from the surface of the semiconductor layer with the same dielectric as the device isolation portion. With this arrangement, the drain-gate isolation portion and the device isolation portion can be formed in the same step. As a result, a production process can be simplified.

The foregoing and other objects, features and effects of the present, invention will be come more apparent from the following description of the embodiments with reference to the attached drawings.

BRIEF DESCRIPTION OF THE DRAWINGS

FIG. 2A is a schematic sectional view showing a step of a production process for the semiconductor device.

DESCRIPTION OF REFERENCE CHARACTERS

Figure 1:
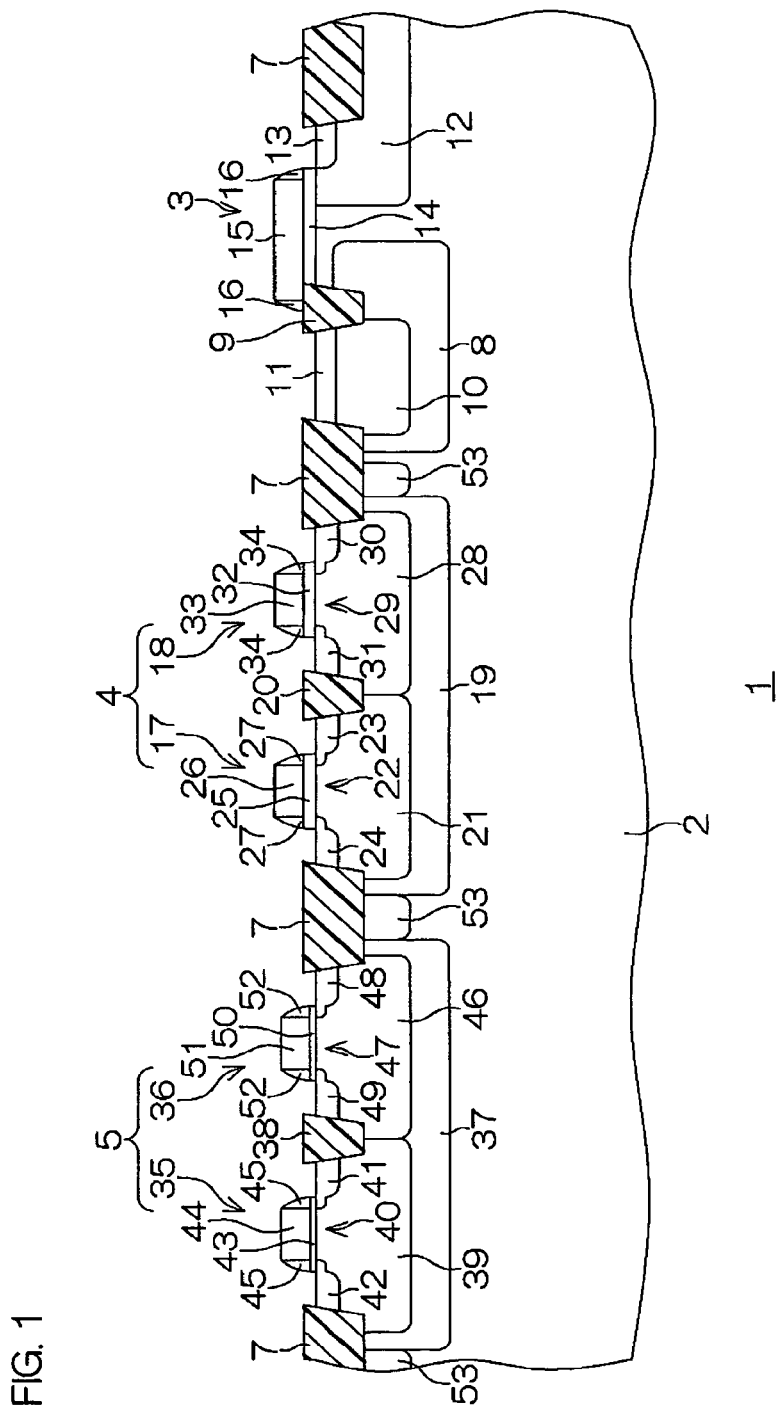
FIG. 1 is a schematic sectional view showing the construction of a semiconductor device according to one embodiment of the present invention.

1: Semiconductor device
2: Semiconductor substrate (semiconductor layer)
3: HVNMOSFET
4: MVCMOSFET
5: LVCMOSFET
6: P-type epitaxial layer (semiconductor layer)
7: Device isolation portion
8: Deep N-type well
9: Drain-gate isolation portion
10: N-type well
11: Contact region
13: Source region
14: Gate insulation film
15: Gate electrode

BEST MODE FOR CARRYING OUT THE INVENTION

Embodiments of the present invention will hereinafter be described in detail with reference to the attached drawings.

FIG. 1 is a schematic sectional view showing the construction of a semiconductor device according to one embodiment, of the present invention.

The semiconductor device 1 includes an HVNMOSFET (high breakdown voltage NMOSFET) 3, an MVCMOSFET (medium breakdown voltage CMOSFET) 4 and an LVCMOSFET (low breakdown voltage CMOSFET) 5 provided on a P-type semiconductor substrate (e.g., a silicon substrate) 2.

A device isolation portion 7 is provided in a surface layer portion of the semiconductor substrate 2 for isolating the HVNMOSFET 3, the MVCMOSFET 4 and the LVCMOSFET 5 from each other. Rectangular regions respectively formed with the HVNMOSFET 3, the MVCMOSFET 4 and the LVCMOSFET 5 are defined by the device isolation portion 7. The device isolation portion 7 has a structure such that a relatively shallow trench (e.g., having a depth of 0.2 to 0.5 μm from the surface of the semiconductor substrate 2) is filled with a dielectric such as $SiO_2$. The dielectric portion slightly projects upward from the surface of the semiconductor substrate 2.

In a rectangular region (hereinafter referred to as "HVNMOSFET formation region") formed with the HVNMOSFET 3, a deep N-type well 8 is provided alongside one edge of the device isolation portion 7 that defines the rectangular region. The deep N-type well 8 is disposed in an inner portion of the semiconductor substrate 2, and an uppermost portion thereof is spaced 0.2 to 0.5 μm downward from the surface of the semiconductor substrate 2. The deep N-type well 8 has a thickness of, for example, 1.5 to 2.5 μm as measured from the uppermost portion to a lowermost portion thereof.

The edge of the device isolation portion 7 alongside which the deep N-type well 8 is provided is hereinafter referred to as "drain-side portion".

In the HVNMOSFET formation region, a drain-gate isolation portion 9 having the same structure as the device isolation portion 7 is provided. That is, the drain-gate isolation portion 9 has a structure such that a trench having the same depth as that of the device isolation portion 7 from the surface of the semiconductor substrate 2 is filled with the same dielectric as the device isolation portion 7. The drain-gate isolation portion 9 extends parallel to the drain-side portion of the device isolation portion 7 as being spaced from the drain-side portion by a distance that is smaller than the width of the deep N-type well 8 as measured in a direction in which the drain-gate isolation portion 9 is opposed to the drain-side portion. A lowermost portion of the drain-gate isolation portion 9 is located in the deep N-type well 8.

An N-type well 10 is provided between the drain-side portion of the device isolation portion 7 and the drain-gate isolation portion 9. A lowermost portion of the N-type well 10 is located in the deep N-type well 8.

An $N^+$-type contact region 11 doped with an N-type impurity at a higher concentration than the N-type well 10 is provided in a surface layer portion of the N-type well 10, more specifically, between the surface of the semiconductor substrate 2 and the deep N-type well 8.

Further, a P-type well 12 is provided alongside an edge of the device isolation portion 7 opposed to the drain-side portion in the HVNMOSFET formation region in the surface layer portion of the semiconductor substrate 2.

The edge of the device isolation portion 7 opposed to the drain-side portion is hereinafter referred to as "source-side portion".

An N-type source region 13 is provided alongside the source-side portion of the device isolation portion 7 in a surface layer portion of the P-type well 12. The source region 13 contacts the source-side portion of the device isolation portion 7. An edge of the source region 13 opposite from the source-side portion is located closer to the source-side portion than to a peripheral edge of the P-type well 12, and spaced a proper distance from the deep N-type well 8.

A gate insulation film 14 of $SiO_2$ is provided alongside the drain-gate isolation portion 9 between the source-side portion of the device isolation portion 7 and the drain-gate isolation portion 9 on the semiconductor substrate 2. The gate insulation film 14 contacts the drain-gate isolation portion 9. Further, an edge of the gate insulation film 14 opposite from the drain-gate isolating portion 9 is located on the P-type well 12, and spaced a minute distance from the source region 13. An upper surface of the gate insulation film 14 is generally flush with an upper surface of the drain-gate isolation portion 9.

A gate electrode 15 of polysilicon is provided on the gate insulation film 14 as extending to the drain-gate isolation portion 9. An end face of the gate electrode 15 adjacent to the source region 13 is generally flush with an end face of the gate insulation film 14.

A sidewall 16 of SiN (silicon nitride) is provided around the gate electrode 15. Side faces of the gate electrode 15 are covered with the sidewall 16. Side faces of the gate insulation film 14 are covered with the drain-gate isolation portion 9 and the sidewall 16.

A drain region of the HVNMOSFET 3 is defined by the deep N-type well 8, the N-type well 10 and the contact region 11. The drain-gate isolation portion 9 is disposed between the drain region and the gate insulation film 14. The drain region and the gate insulation film 14 are isolated from each other in non-contact spaced relation by the drain-gate isolation portion 9.

In the HVNMOSFET 3, the drain region and the gate insulation film 14 are spaced from each other, so that an electric field generated between the drain region and the gate insulation film 14 is weakened. This prevents field concentration from occurring in the vicinity of the drain region and the gate insulation film 14, thereby preventing breakdown of the gate insulation film 14 which may otherwise occur due to the field concentration. Therefore, even if the gate insulation film 14 has a smaller thickness, a higher breakdown voltage can be achieved. Even if the gate insulation film 14 has a thickness less than 130 Å, for example, a high breakdown voltage on the order of 30 V can be achieved. In addition, ON resistance can be reduced by reducing the thickness of the gate insulation film 14. As a result, it is possible to achieve improvement in the breakdown voltage of the HVMOSFET 3 as well as the reduction in ON resistance.

Since the drain region and the gate insulation film 14 are spaced from each other and most of an interface of the drain region (the deep N-type well 8) contacts the semiconductor substrate 2, a surge current flows to be distributed into the semiconductor substrate 2 from the drain region when a surge voltage is inputted into the drain region. Therefore, the surge current does not flow into the gate insulation film 14 from the drain region, and the field concentration does not occur between the drain region and the gate insulation film 14. Thus, the HVNMOSFET 3 has a higher ESD resistance.

The MVCMOSFET 4 includes an NMOSFET 17 and a PMOSFET 18 of a planar type. The NMOSFET 17 and the PMOSFET 18 each have a lower breakdown voltage than the HVNMOSFET 3 (e.g., a breakdown voltage of 3 to 10 V).

A deep N-type well 19 is provided in a region formed with the MVCMOSFET 4. A PN isolation portion 20 having the same structure as the device isolation portion 7 is provided in this region. That is, the PN isolation portion 20 has a structure such that a trench having the same depth as that of the device isolation portion 7 from the surface of the semiconductor substrate 2 is filled with the same dielectric as the device isolation portion 7. The PN isolation portion 20 divides the MVCMOSFET formation region into an NMOSFET formation region formed with the NMOSFET 17 and a PMOSFET formation region formed with the PMOSFET 18.

A P-type well 21 is provided in the NMOSFET formation region in a surface layer portion of the deep N-type well 19. An N$^+$-type source region 23 and an N$^+$-type drain region 24 are provided on opposite sides of a channel region 22 in a surface layer portion of the P-type well 21. End portions of the source region 23 and the drain region 24 adjacent to the channel region 22 are each located at a smaller depth, and each have a lower impurity concentration. That is, the NMOSFET 17 has an LDD structure for prevention of the short channel effect.

A gate insulation film 25 of SiO$_2$ is provided on the channel region 22. The gate insulation film 25 has the same thickness as the gate insulation film 14 of the HVMOSFET 3. A gate electrode 26 of polysilicon is provided on the gate insulation film 25. A sidewall 27 of SiN is provided around the gate electrode 26. Side surfaces of the gate insulation film 25 and the gate electrode 26 are covered with the sidewall 27.

An N-type well 28 is provided in the PMOSFET formation region in the surface layer portion of the deep N-type well 19. A P$^+$-type source region 30 and a P$^+$-type drain region 31 are provided on opposite sides of a channel region 29 in a surface layer portion of the N-type well 28. End portions of the source region 30 and the drain region 31 adjacent to the channel region 29 are each located at a smaller depth, and each have a lower impurity concentration. That is, the PMOSFET 18 has an LDD structure for prevention of the short channel effect.

A gate insulation film 32 of SiO$_2$ is provided on the channel region 29. The gate insulation film 32 has the same thickness as the gate insulation film 14 of the HVMOSFET 3. A gate electrode 33 of polysilicon is provided on the gate insulation film 32. A sidewall 34 of SiN is provided around the gate electrode 33. Side surfaces of the gate insulation film 32 and the gate electrode 33 are covered with the sidewall 34.

The LVCMOSFET 5 includes an NMOSFET 35 and a PMOSFET 36 of a planar type. The NMOSFET 35 and the PMOSFET 36 each have a lower breakdown voltage than the NMOSFET 17 and the PMOSFET 18 (e.g., a breakdown voltage of 1 to 5 V).

A deep N-type well 37 is provided in a region formed with the LVCMOSFET 5.

A PN isolation portion 38 having the same structure as the device isolation portion 7 is provided in this region. That is, the PN isolation portion 38 has a structure such that a trench having the same depth as that of the device isolation portion 7 from the surface of the semiconductor substrate 2 is filled with the same dielectric as the device isolation portion 7. The PN isolation portion 38 divides the LVCMOSFET formation region into an NMOSFET formation region formed with the NMOSFET 35 and a PMOSFET formation region formed with the PMOSFET 36.

A P-type well 39 is provided in the NMOSFET formation region in a surface layer portion of the deep N-type well 37. An N$^+$-type source region 41 and an N$^+$-type drain region 42 are provided on opposite sides of a channel region 40 in a surface layer portion of the P-type well 39. End portions of the source region 41 and the drain region 42 adjacent to the channel region 40 are each located at a smaller depth, and each have a lower impurity concentration. That is, the NMOSFET 35 has an LDD structure for prevention of the short channel effect.

A gate insulation film 43 of SiO$_2$ is provided on the channel region 40. The gate insulation film 43 has a smaller thickness than the gate insulation film 14 of the HVMOSFET 3. A gate electrode 44 of polysilicon is provided on the gate insulation film 43. A sidewall 45 of SiN is provided around the gate electrode 44. Side faces of the gate insulation film 43 and the gate electrode 44 are covered with the side wall 45.

An N-type well 46 is provided in the PMOSFET formation region in the surface layer portion of the deep N-type well 37. A P$^+$-type source region 48 and a P$^+$-type drain region 49 are provided on opposite sides of a channel region 47 in a surface layer portion of the N-type well 46. End portions of the source region 48 and the drain region 49 adjacent to the channel region 47 are each located at a smaller depth, and each have a lower impurity concentration. That is, the PMOSFET 36 has an LDD structure for prevention of the short channel effect.

A gate insulation film 50 of $SiO_2$ is provided on the channel region 47. The gate insulation film 50 has a thickness that is smaller than that of the gate insulation film 14 of the HVMOSFET 3 and equal to that of the gate insulation film 43 of the NMOSFET 37. A gate electrode 51 of polysilicon is provided on the gate insulation film 50. A sidewall 52 of SiN is provided around the gate electrode 51. Side faces of the gate insulation film 50 and the gate electrode 51 are covered with the side wall 52.

A P-type well 53 is provided below the device isolation portion 7 in contact with the device isolation portion 7.

FIGS. 2A to 2E are schematic sectional views showing a process sequence of a production process for the semiconductor device 1.

As shown in FIG. 2A, trenches for a device isolation portion 7, a drain-gate isolation portion 9 and PN isolation portions 20, 38 are formed in a surface layer portion of a semiconductor substrate 2 by reactive ion etching. Thereafter, $SiO_2$ is deposited on the semiconductor substrate 2 to a thickness such as to entirely fill the trenches by an HDP-CVD (high density plasma chemical vapor deposition) method. Then, a portion of the resulting $SiO_2$ film present outside the trenches is selectively removed, whereby the $SiO_2$ film remains only in and above the trenches. Thus, the device isolation portion 7, the drain-gate isolation portion 9 and the PN isolation portions 20, 38 are formed. The selective removal of the $SiO_2$ film may be achieved by a CMP (chemical mechanical polishing) method.

Figure 2B:
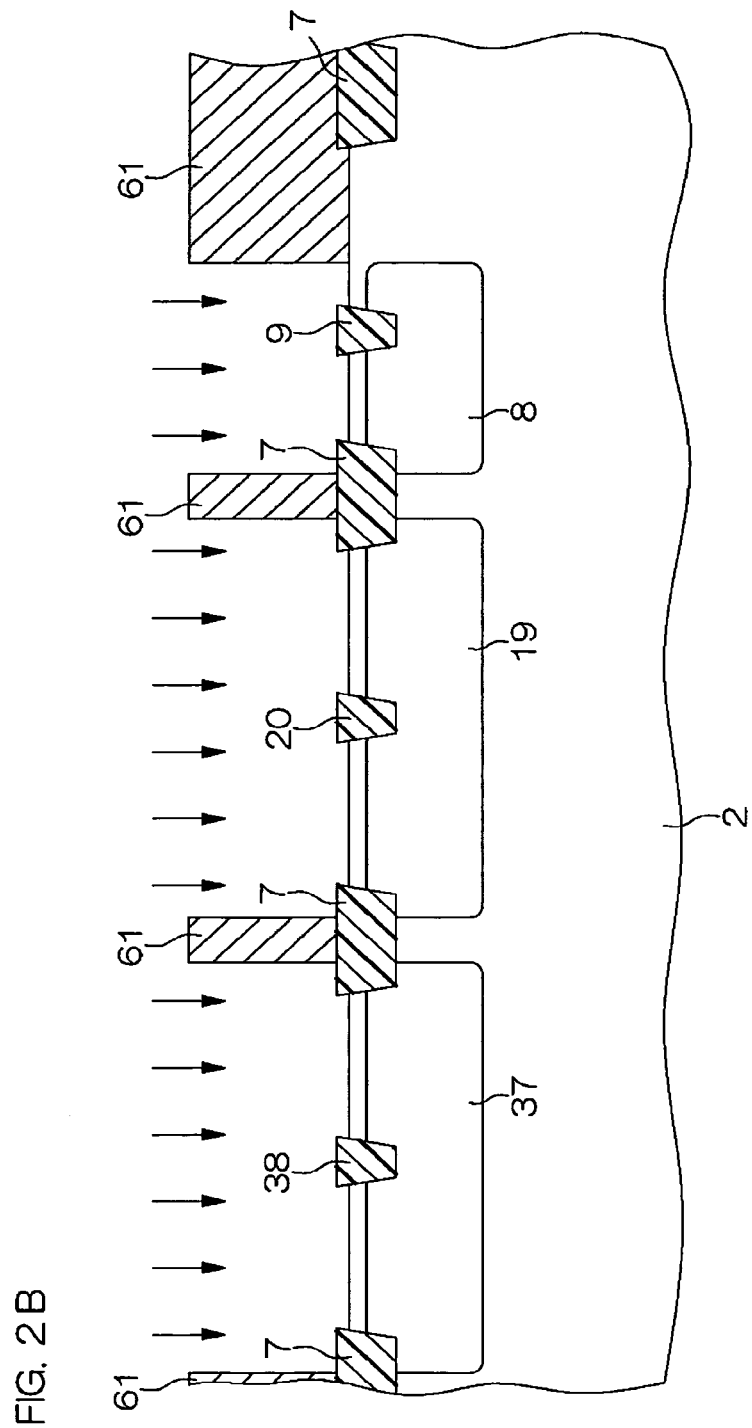
FIG. 2B is a schematic sectional view showing a step subsequent to the step shown in FIG. 2A.

In turn, as shown in FIG. 2B, a resist film 61 having openings in association with regions to be formed with deep N-type wells 8, 19, 37 is formed on the semiconductor substrate 2 by the photolithography technique. Then, an N-type impurity (e.g., arsenic ions) is implanted into the semiconductor substrate 2 by using the resist film 61 as a mask, whereby the deep N-type wells 8, 19, 37 are formed. After the implantation or the N-type impurity, the resist film 61 is removed.

Figure 2C:
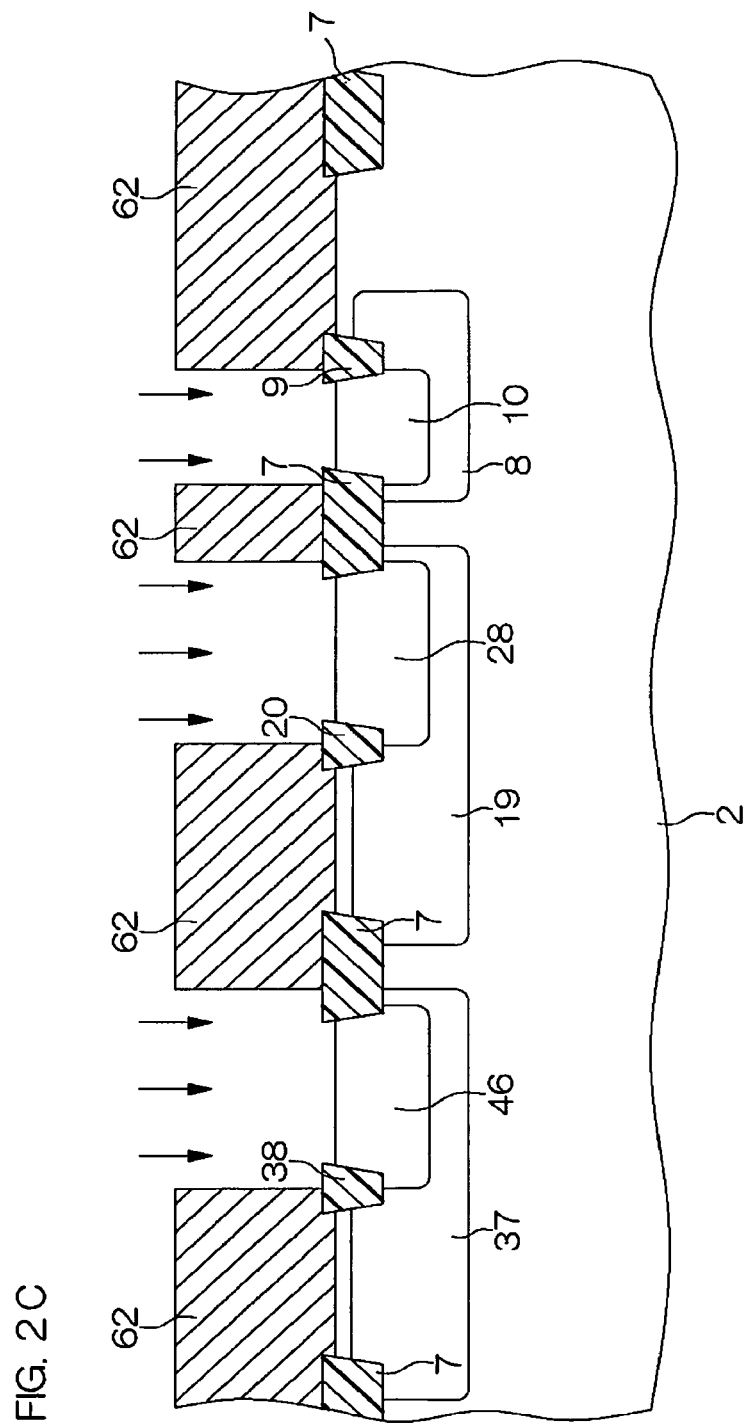
FIG. 2C is a schematic sectional view showing a step subsequent to the step shown in FIG. 2B.

Thereafter, as shown in FIG. 2C, a resist film 62 having openings in association with regions to be formed with N-type wells 10, 28, 46 is formed on the semiconductor substrate 2 by the photolithography technique. Then, the N-type impurity is implanted into the semiconductor substrate 2 by using the resist film 62 as a mask, whereby the N-type wells 10, 28, 46 are formed. After the implantation of the N-type impurity, the resist film 62 is removed.

Figure 2D:
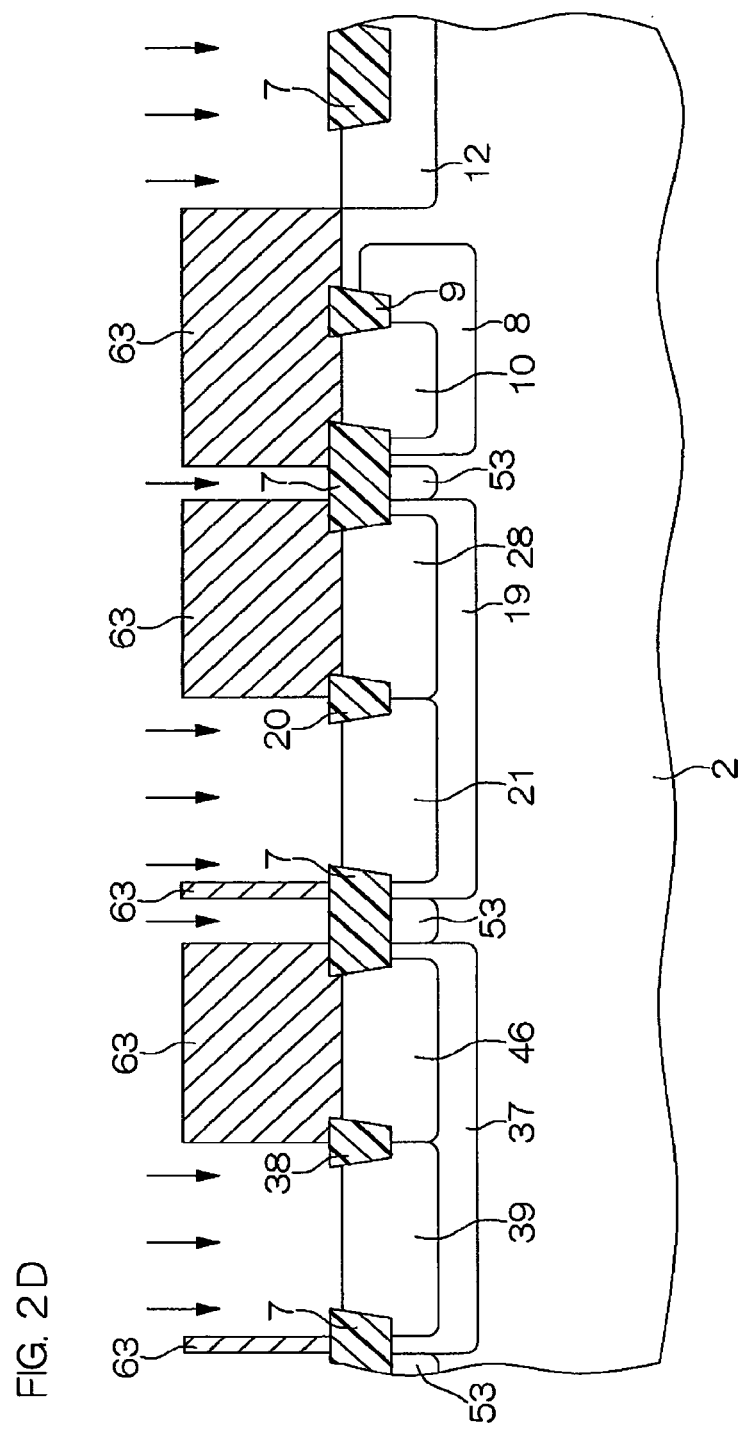
FIG. 2D is a schematic sectional view showing a step subsequent to the step shown in FIG. 2C.

Subsequently, as shown in FIG. 2D, a resist, film 63 having openings in association with regions to be formed with P-type wells 12, 21, 39, 53 is formed on the semiconductor substrate 2 by the photolithography technique. Then, a P-type impurity (e.g., boron ions) is implanted into the semiconductor substrate 2 by using the resist film 63 as a mask, whereby the P-type wells 12, 21, 39, 53 are formed. After the implantation of the P-type impurity, the resist film 63 is removed.

Figure 2E:
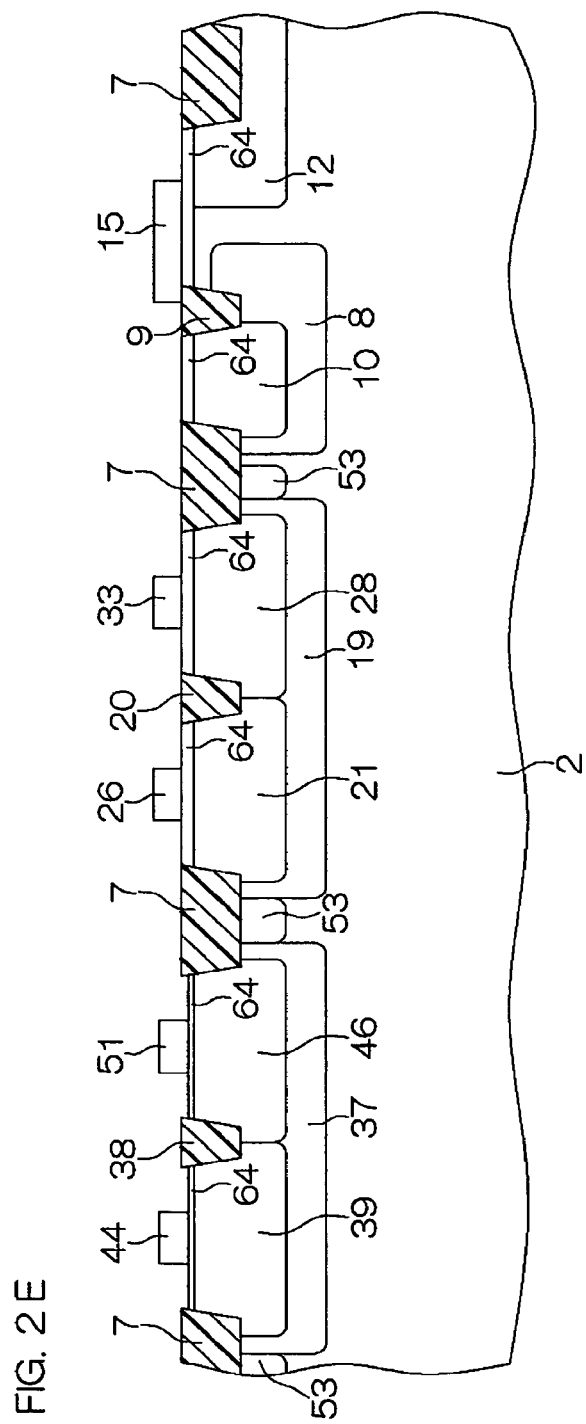
FIG. 2E is a schematic sectional view showing a step subsequent to the step shown in FIG. 2D.

After the removal of the resist film 63, as shown in FIG. 2E, $SiO_2$ films 64 are formed on a surface of the semiconductor substrate 2 by a thermal oxidation method. More specifically, a $SiO_2$ film, having a predetermined thickness is formed on the entire surface of the semiconductor substrate 2 in the first thermal oxidation step. Then, a portion of the $SiO_2$ film present on a region to be formed with an LVCMOSFET 5 is selectively removed. In the second thermal oxidation step, a $SiO_2$ film is formed on a portion of the semiconductor substrate 2 exposed by the selective removal of the $SiO_2$ film, and portions of the $SiO_2$ film remaining on regions to be formed, with the HVMOSFET 3 and the MVCMOSFET 4 are further grown (the remaining $SiO_2$ film portions are thickened). Thus, $SiO_2$ films 64 are formed as having different thicknesses in the region to be formed with the LVCMOSFET 5 and in the regions to be formed with the HVMOSFET 3 and the HMVCMOSFET 4.

Subsequently, a polysilicon film is formed over the $SiO_2$ films 64 by a thermal CVD method. Thereafter, a portion of the polysilicon film is selectively removed, whereby gate electrodes 15, 26, 33, 44, 51 are formed. The selective removal of the polysilicon film is achieved, for example, by RIE (reactive ion etching). Further, an SiN film is formed over the $SiO_2$ films 64 and then etched back, whereby sidewalls 16, 27, 34, 45, 52 (see FIG. 1) are respectively formed around the gate electrodes 15, 26, 33, 44, 51. At this time, portions of the $SiO_2$ films 64 not opposed to the gate electrodes 15, 26, 33, 44, 51 and the sidewalls 16, 27, 34, 45, 52 are removed. Thus, gate insulation films 14, 25, 32, 43, 50 are formed as shown in FIG. 1.

Thereafter, the P-type impurity is implanted into surface layer portions of the N-type wells 28, 46 to a lower concentration, and the N-type impurity is implanted into surface layer portions of the P-type wells 21, 39 to a lower concentration. Then, the P-type impurity is implanted into the surfaces of the N-type wells 10, 28, 46 to a higher concentration from exposed surface portions of the N-type wells 10, 28, 46, whereby a contact region 11 and drain regions 24, 31, 42, 49 are formed. Further, the N-type impurity is implanted, into the surfaces of the P-type wells 12, 21, 39 to a higher concentration from exposed surface portions of the P-type wells 12, 21, 39, whereby source regions 13, 23, 30, 41, 48 are formed.

The semiconductor device having the construction shown in FIG. 1 is produced through the steps described above.

According to this production method, the drain-gate isolation portion 9, the device isolation portion 7 and the PN isolation portions 20, 38 can be formed in the same step. Further, fabrication of the HVNMOSFET 3 can be achieved during fabrication of the MVCMOSFET 4 and the LVCMOSFET 5. Thus, the HVNMOSFET 3 can be fabricated on the semiconductor substrate 2 on which the MVCMOSFET 4 and the LVCMOSFET 5 are to be mounted without the need for adding an additional step to a process for the fabrication of the MVCMOSFET 4 and the LVCMOSFET 5.

An annealing process for activating the ions may be performed as required in addition to the aforementioned process steps.

Figure 3:
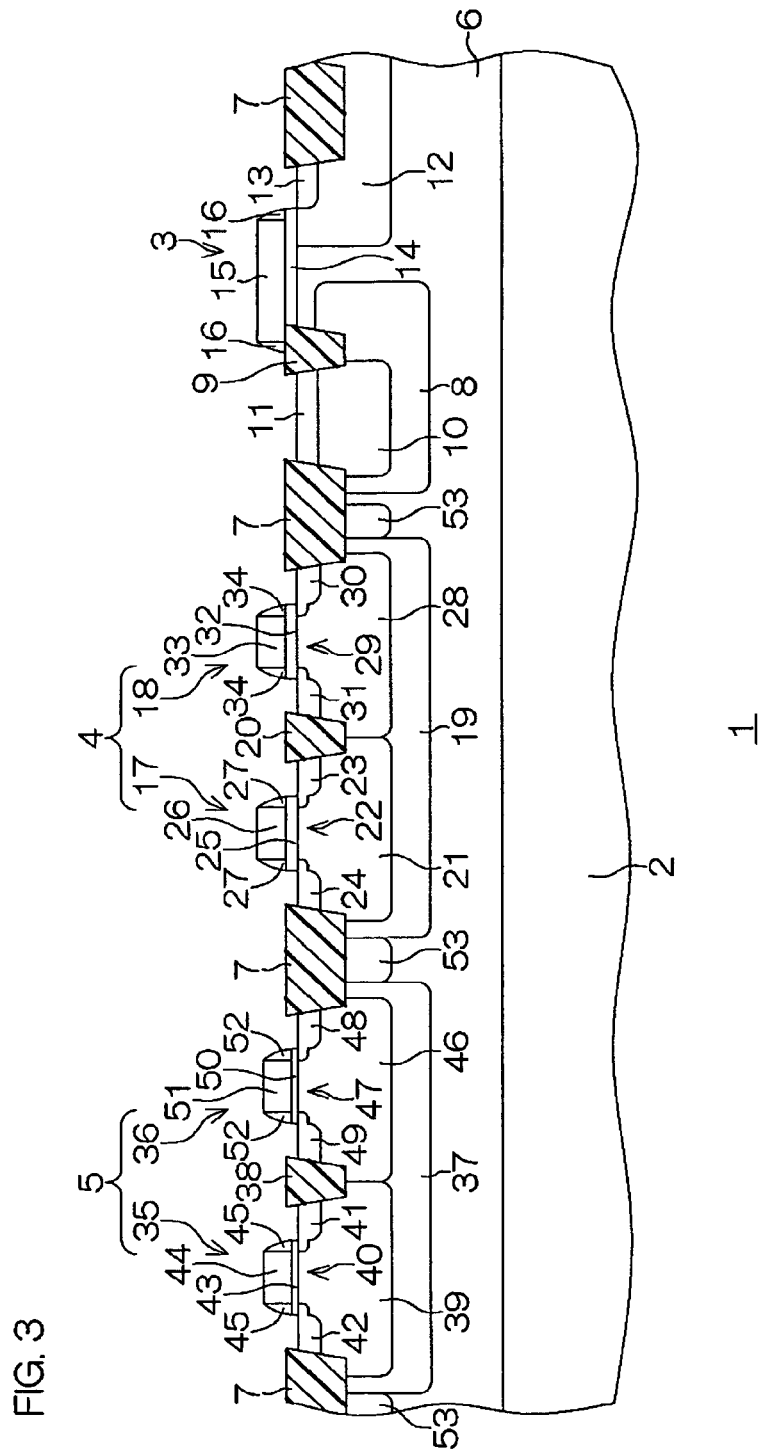
FIG. 3 is a schematic sectional view showing the construction of a semiconductor device according to another embodiment of the present invention.
Figure 4:
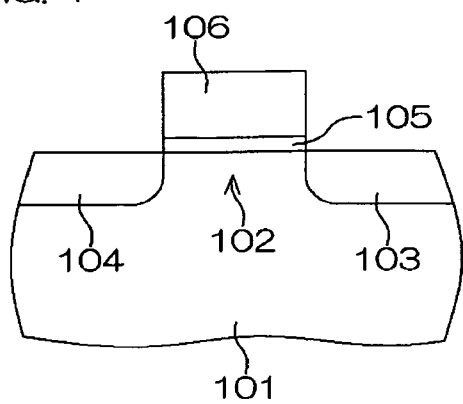
FIG. 4 is a schematic sectional view showing the basic construction of a MOSFET.

FIG. 3 is a schematic sectional view showing the construction of a semiconductor device according to another embodiment of the present invention. In FIG. 3, components corresponding to those shown in FIG. 1 will be denoted by the same reference characters as in FIG. 1.

The semiconductor device 1 shown in FIG. 3 includes a P-type epitaxial layer 6 provided on a semiconductor substrate 2. Components of an HVNMOSFET 3, an MVCMOSFET 4 and an LVCMOSFET 5, and a device isolation portion 7 which isolates the HVNMOSFET 3, the MVCMOSFET 4 and the LVCMOSFET 5 from each other are provided in the P-type epitaxial layer 6.

This arrangement provides the same effects as the arrangement shown in FIG. 1.

While the embodiments of the present invention have thus described, the invention may be embodied in other ways. The HVNMOSFET 3 is mounted as a high breakdown voltage MOSFET on the semiconductor substrate 2 by way of example, but a high breakdown voltage PMOSFET including semiconductor portions having conductivity types reversed from those of the semiconductor portions of the HVNMOS- FET 3 (e.g., including P-type portions instead of the N-type portions) is employed instead of the HVNMOSFET 3.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-161493 filed in the Japanese Patent Office on Jun. 19, 2007, the disclosure of which is incorporated herein by reference in its entirety.

What is claimed is:

1. A semiconductor device comprising:
   a semiconductor layer;
   a first conductive region provided in a surface of the semiconductor layer;
   a second conductive region provided in a surface layer portion of the semiconductor layer in spaced relation from the first conductive region, the second conductive region including a well disposed in the surface layer portion, an upper most portion of the well being spaced apart from said surface of the semiconductor layer;
   a gate insulation film provided in contact with a portion of said surface of the semiconductor layer present between the first conductive region and the second conductive region;
   a gate electrode provided on the gate insulation film; and
   an isolation portion, in a form of a trench isolation structure, provided between the second conductive region and the gate insulation film for isolating the second conductive region and the gate insulation film from each other so that the second conductive region and the gate insulation film do not touch each other, wherein no such isolation portion is provided between the first conductive region and the gate insulation film,
   wherein the gate insulation film touches the isolation portion and is spaced apart from the second conductive region so that the gate insulation film does not touch the second conductive region,
   the well extends toward the first conductive region beyond the isolation portion, and
   the semiconductor layer has a semiconductor region disposed between the first conductive region and the well, the semiconductor region extending between the gate insulation film and the upper most portion of the well so as to touch the isolation portion.

2. A semiconductor device as set forth in claim 1, wherein the first conductive region and the second conductive region are of a first conductive type, and the semiconductor region is of a second conductive type different from the first conductive type.

3. A semiconductor device as set forth in claim 1, further comprising:
   a CMOS transistor; and
   a device isolation portion formed by filling a trench formed in the surface of the semiconductor layer with a dielectric for isolating the CMOS transistor from a MOS transistor including the first conductive region, the second conductive region, the gate insulation film and the gate electrode.

4. A semiconductor device as set forth in claim 3, wherein the isolation portion is formed by filling a trench having the same depth as that of the device isolation portion from the surface of the semiconductor layer with the same dielectric as the device isolation portion.

5. A semiconductor device as set forth in claim 1, wherein the isolation portion is arranged to separate the second conductive region and the gate insulation film with a space therebetween when viewed from a direction normal to the surface of the semiconductor layer.

6. A semiconductor device as set forth in claim 1, wherein the isolation portion includes an upper surface that is substantially flush with an upper surface of the gate insulation film.

7. A semiconductor device as set forth in claim 3, wherein the CMOS transistor includes a gate insulation film having substantially the same thickness as the gate insulation film of the MOS transistor.

8. A semiconductor device as set forth in claim 3, wherein the CMOS transistor includes a gate insulation film having a thickness less than a thickness of the gate insulation film of the MOS transistor.

9. A semiconductor device as set forth in claim 3, wherein the CMOS transistor has a lower breakdown voltage than the MOS transistor.

10. A semiconductor device as set forth in claim 1, wherein the second conductive region is electrically connected to an external terminal to which a surge voltage is applied.

11. A semiconductor device as set forth in claim 1, wherein the isolation portion has a depth of about 0.2 to 0.5 μmeters from the surface of the semiconductor layer.

12. A semiconductor device as set forth in claim 1, wherein the semiconductor region is disposed between the first conductive region and the well on a straight line extending from the first conductive region to the well.

13. A semiconductor device as set forth in claim 12, wherein the semiconductor region extends between the gate insulation film and the well along a straight line extending from the gate insulation film to the well.

14. A semiconductor device as set forth in claim 1, wherein the upper most portion of the well is spaced apart from said surface of the semiconductor layer in a first direction, and said well extends toward the first conductive region beyond the isolation portion in a second direction, the first direction and the second direction being perpendicular to each other and the semiconductor region being disposed in the first direction.

15. A semiconductor device as set forth in claim 1, wherein the well is disposed on opposite sides of the isolation portion.

16. A semiconductor device comprising:
   a low breakdown voltage transistor region including a first gate insulation film having a first thickness;
   a high breakdown voltage transistor region including a second gate insulation film having a second thickness greater than the first thickness; and
   a middle breakdown voltage transistor region including a third gate insulation film having the second thickness,
   the high breakdown voltage transistor region including a high breakdown voltage transistor having a higher breakdown voltage than the low breakdown voltage transistor region, the middle breakdown voltage transistor region including a middle breakdown voltage transistor having a breakdown voltage higher than the low breakdown voltage transistor region and lower than the high breakdown voltage transistor,
   wherein the high breakdown voltage transistor has a first conductive region, a second conductive region and an isolation portion, in a form of a trench isolation structure, arranged between the second conductive region and the second gate insulation film so as to isolate the second conductive region and the second gate insulation film from each other so that the second conductive region and the second gate insulation film do not touch each other, the second conductive region including a well disposed in a surface layer portion of a semiconductor layer, and the middle breakdown voltage transistor has no such isolation portion and has a drain region in contact with the third gate insulation film, wherein the second gate insulation film touches the isolation portion and is spaced apart from the second conductive region of the high breakdown voltage transistor so as to not touch the second conductive region of the high breakdown voltage transistor, and further wherein the semiconductor layer has a semiconductor region disposed between the first conductive region and the well, the semiconductor region extending between the second gate insulation film and the well so as to touch the isolation film.

17. A semiconductor device as set forth in claim 16, wherein the first conductive region and the second conductive region are of a first conductive type, and the semiconductor region is of a second conductive type different from the first conductive type.

18. A semiconductor device as set forth in claim 16, wherein the second conductive region of the high breakdown voltage transistor is electrically connected to an external terminal to which a surge voltage is applied.

19. A semiconductor device as set forth in claim 16, wherein the isolation portion is arranged to separate the second conductive region of the high breakdown voltage transistor and the second gate insulation film with a space therebetween.

20. A semiconductor device as set forth in claim 16, wherein the isolation portion has an upper surface that is substantially flush with an upper surface of the second gate insulation film.

21. A semiconductor device as set forth in claim 16, wherein the semiconductor region is disposed between the first conductive region and the well on a straight line extending from the first conductive region to the well.

22. A semiconductor device as set forth in claim 21, wherein the semiconductor region extends between the second gate insulation film and the well along a straight line extending from the second gate insulation film to the well.

* * * * *